US010605853B2

(12) United States Patent
Moell et al.

(10) Patent No.: US 10,605,853 B2
(45) Date of Patent: Mar. 31, 2020

(54) METHOD AND DEVICE FOR EXTENDED INSULATION FAULT LOCATION IN AN UNGROUNDED POWER SUPPLY SYSTEM AND METHOD FOR STATUS MONITORING OF THE POWER SUPPLY SYSTEM

(71) Applicant: Bender GmbH & Co. KG, Gruenberg (DE)

(72) Inventors: Winfried Moell, Laubach (DE); Eckhard Broeckmann, Giessen (DE); Oliver Schaefer, Gruenberg (DE); Torsten Mager, Schwalmtal (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 15/381,159

(22) Filed: Dec. 16, 2016

(65) Prior Publication Data

US 2017/0176511 A1    Jun. 22, 2017

(30) Foreign Application Priority Data

Dec. 17, 2015   (DE) .......................... 10 2015 122 128

(51) Int. Cl.
*G01R 31/08*    (2020.01)
*G01R 31/11*    (2006.01)
(Continued)

(52) U.S. Cl.
CPC ............ *G01R 31/086* (2013.01); *G01R 31/11* (2013.01); *G01R 31/025* (2013.01); *G01R 31/1272* (2013.01)

(58) Field of Classification Search
CPC ...... G01R 31/00; G01R 31/08; G01R 31/086; G01R 31/12; G01R 31/1272; G01R 31/11;
(Continued)

(56) References Cited

U.S. PATENT DOCUMENTS

| 6,392,401 B1 * | 5/2002 | Cooke ................... G01R 15/18 324/115 |
| 2002/0053914 A1 * | 5/2002 | Dring .................... G01R 31/11 324/536 |

(Continued)

*Primary Examiner* — Son T Le
(74) *Attorney, Agent, or Firm* — King & Schickli, PLLC

(57) ABSTRACT

A method for insulation fault location in a branched, ungrounded power supply system includes determining an insulation fault position being carried out in combination with evaluating information for identifying a faulty cable outlet according to the method of time-domain reflectometry. Furthermore, the invention relates to a method for insulation fault identification in a branched power supply system and for status monitoring of the branched power supply system, an image of all reflection positions on the power supply system being carried out based on a method of time-domain reflectometry. Moreover, the invention relates to a device for insulation fault location in a branched, ungrounded power supply system having the function units insulation fault test apparatus and insulation fault evaluation device having a measuring current transformer, the device comprising a time-domain reflectometer having a controller so as to implement the method according to the invention.

10 Claims, 1 Drawing Sheet

(51) Int. Cl.
*G01R 31/02* (2006.01)
*G01R 31/12* (2020.01)

(58) Field of Classification Search
CPC .............. G01R 31/025; G01R 27/2617; G01R 29/085; G01R 27/06
See application file for complete search history.

(56) References Cited

U.S. PATENT DOCUMENTS

| | | |
|---|---|---|
| 2004/0019443 A1 | 1/2004 | Jones et al. |
| 2005/0057869 A1* | 3/2005 | Hale .................... H02H 1/0015 361/64 |
| 2005/0289408 A1* | 12/2005 | Jani ...................... G01R 31/024 714/712 |
| 2006/0182269 A1 | 8/2006 | Lo et al. |
| 2008/0204034 A1* | 8/2008 | Blades .................. G01R 31/02 324/522 |
| 2010/0315092 A1* | 12/2010 | Nacson ................ G01R 31/025 324/510 |
| 2011/0181295 A1 | 7/2011 | Haugen et al. |
| 2011/0227582 A1 | 9/2011 | Ahamed et al. |
| 2011/0316559 A1 | 12/2011 | Haffner et al. |
| 2014/0049264 A1* | 2/2014 | Ganesh ................ G01R 31/025 324/551 |
| 2015/0103447 A1 | 4/2015 | Brouwer et al. |
| 2015/0212025 A1 | 7/2015 | Francis-Buller et al. |
| 2016/0276820 A1* | 9/2016 | Olivas .................. H02H 1/003 |

\* cited by examiner

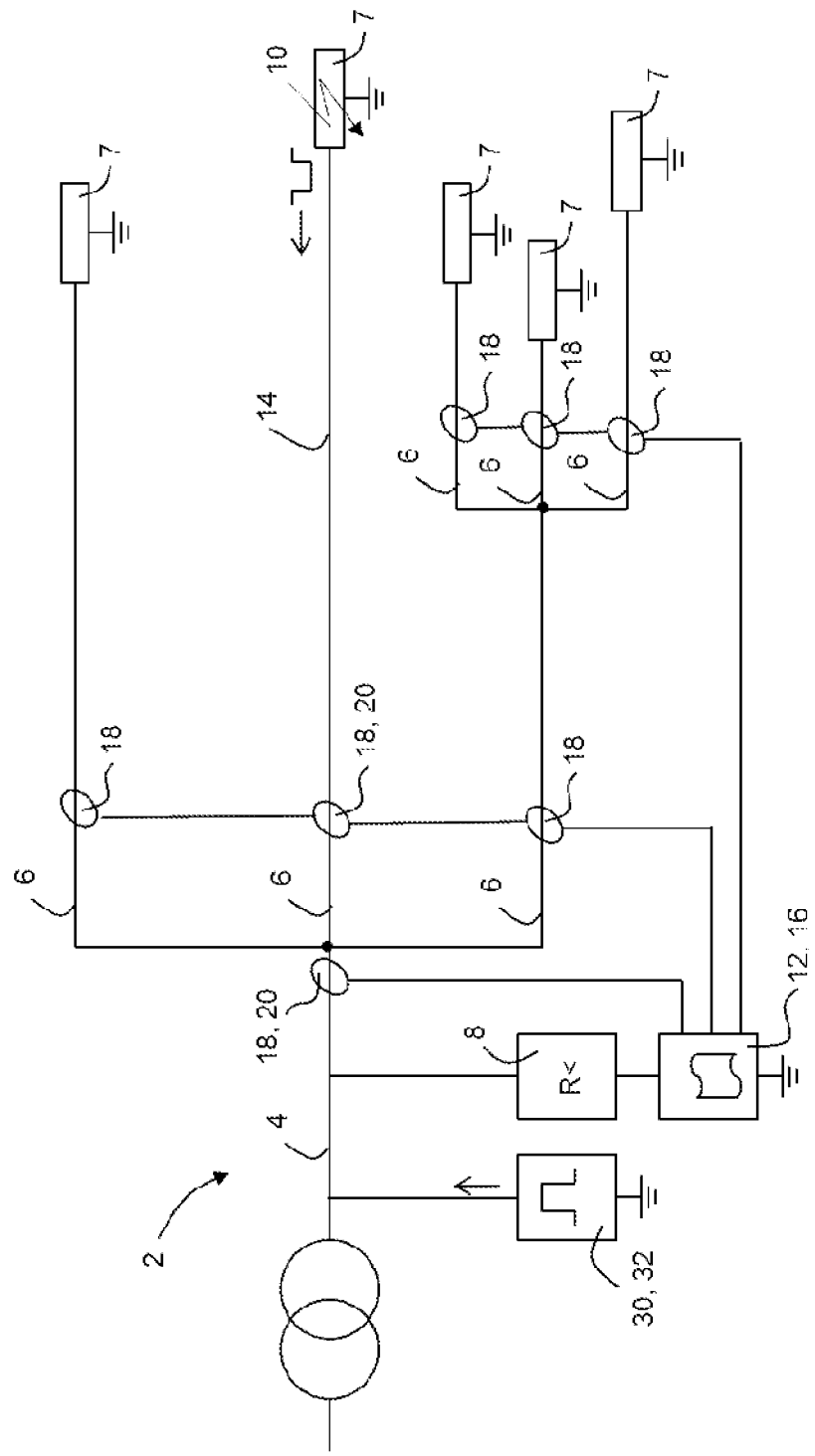

METHOD AND DEVICE FOR EXTENDED INSULATION FAULT LOCATION IN AN UNGROUNDED POWER SUPPLY SYSTEM AND METHOD FOR STATUS MONITORING OF THE POWER SUPPLY SYSTEM

The disclosure of German Patent Application No. 10 2015 122 128.4, filed Dec. 17, 2015, is incorporated herein by reference.

TECHNICAL FIELD

The invention relates to a method for insulation fault location in a branched, ungrounded power supply system, the method comprising the following steps: supplying a test current in at least one active conductor of the ungrounded power supply system; detecting a test current portion in a cable outlet of the ungrounded power supply system; evaluating the detected test current portion for identifying a faulty cable outlet.

Furthermore, the invention relates to a method for insulation fault identification in a branched power supply system and for status monitoring of the branched power supply system.

Moreover, the invention relates to a device for insulation fault location in a branched, ungrounded power supply system having the function units insulation fault test apparatus and insulation fault evaluation device having a measuring current transformer.

BACKGROUND

Methods for insulation fault location and the devices (insulation fault location devices) implementing these methods are known from the state of the art and are used for locating insulation faults in power supply systems, in particular for determining the faulty cable outlet in the event of a first (insulation) fault occurring in an ungrounded network.

Should an insulation fault occur in the ungrounded power supply system, it will initially be identified and reported by an insulation monitoring device. This report initiates the insulation fault location by the insulation monitoring device or by an insulation fault test apparatus, which as part of an insulation fault location device can also be realized as an insulation fault test device, producing a test current and supplying the test current into the power supply system. This test current signal is detected by all measuring current transformers, which are arranged in the faulty electric circuit having the faulty cable outlet, and evaluated and displayed via an insulation fault evaluation device. The faulty cable outlet can be determined by assigning the measuring current transformer to the electric circuit or rather the cable outlet.

The cable outlet in the branched power supply system having the insulation fault is then identified, although the exact position of the insulation fault on this faulty cable outlet is still not known.

In order to quickly repair the insulation fault, however, knowing the exact fault position on the faulty cable outlet is useful.

SUMMARY

The object of the invention at hand, therefore, is to develop a method and a device by means of which the exact fault position of an insulation fault on a faulty cable outlet of an ungrounded power supply system can be determined.

The object is attained based on a method for determining an insulation fault position according to a method of time-domain reflectometry in combination with the evaluation of information for identifying the faulty cable outlet.

The main idea of the invention at hand advantageously relies on combining the knowledge acquired regarding the position of a faulty cable outlet by means of an insulation fault location according to the state of the art with the result of an insulation position location according to the method of time-domain reflectometry. The cable outlet having an insulation fault is identified in the branched power supply system by means of an insulation fault location relying mostly on known mechanisms of the test current supply and test current evaluation. Based on this information, the exact fault position on the cable outlet identified as faulty is determined by means of a measuring pulse according to a method of time-domain reflectometry. Simultaneously, the information acquired by the method of time-domain reflectometry can be used within the scope of a permanent status monitoring of the power supply system for determining the fault position.

By combining the findings from both methods—"classic" insulation fault location on the one hand and disturbing source location by means of time-domain reflectometry on the other hand—, the insulation fault can be reliably identified, its exact location is determined and it can be quickly repaired in the interest of electric security.

In another advantageous embodiment, determining the insulation fault position on the cable outlet identified as faulty comprises the following steps: (a) producing the time-domain reflectometry measuring pulse and supplying the measuring pulse to the active conductor(s) of the power supply system; (b) receiving and recording a first reflected measuring signal consisting of a first sequence of reflected measuring signals as a temporal image of all reflection positions in the power supply system should there be no insulation fault detected; (c) receiving a second reflected measuring signal consisting of a second sequence of reflected measuring pulses in the event of an insulation fault; (d) deducting a difference signal, which represents the insulation fault, from the first reflected measuring signal and the second measuring signal; and (e) determining the insulation fault position on the identified faulty cable outlet by evaluating a running time of the difference signal representing the insulation fault by using the information by means of which the cable outlet was identified as faulty.

After generating and supplying the measuring pulse, a reflected measuring signal is received and recorded should there be no insulation fault detected (meaning an insulation monitoring device installed in the power supply system does not report an insulation fault). The reflected measuring signal consists of a first sequence of reflected measuring pulses which represent a temporal image of all reflection positions in the power supply system. This resulting reflection profile of the unfaulty power supply system saved during a "learning phase" serves as a reference pattern for being compared to a second measuring signal received after an occurring first fault—the occurring insulation fault being signaled via the insulation monitoring device. This second measuring signal consists of a second sequence of reflected measuring pulses which now comprises an additional reflected "insulation fault" measuring pulse with respect to the first sequence saved as a reference pattern. By directly comparing the first reflected measuring signal to the second reflected measuring signal or by indirectly comparing them, by first converting the received measuring pulses to correlation functions via correlation calculations, a difference signal is derived which represents the insulation fault. By evaluating a running time—the propagation speed of the measuring signal on the cable being known—of the difference signal representing the insulation fault, the exact fault position can be determined once informed on the faulty cable outlet.

During the learning phase, assigning the received measuring signals to cable outlets can be carried out via known systemic reflections (for example known cable terminations) or via test reflections. Generally, simply knowing that an insulation fault has occurred on a known cable outlet can suffice to identify a newly occurring measuring pulse as an insulation fault measuring pulse.

Further advantageous embodiments according to the generation and supply of the measuring signal as well as the processing of the reflected measuring signal according to different methods can be carried out which all rely on the principle of time-domain reflectometry.

However, it is not the object of the invention at hand to locate an occasionally occurring insulation fault while occurring—as is common in a typical usage of the SSTDR method (spread-spectrum time-domain reflectometry), cf. below—but rather to locate the fault position of an existing insulation fault in combination with a conventional insulation fault location device.

In the simplest case, a single pulse can be produced and supplied as a measuring pulse. The single pulse is preferably a square-edged pulse in the shape of a rectangular pulse, the reflected measuring pulse being used directly or by means of a correlation calculation for further processing. For locating disturbing signals by means of running time measuring, this variant of the time-domain reflectometry is known as the TDR method (time-domain reflectometry).

It proves to be less susceptible to disturbances if a spreading code is preferably used as a measuring pulse having a spectral spreading and processing the reflected measuring signal is carried out in a correlation calculation of the known spreading code with the received reflected measuring signal (STDR—sequence time-domain reflectometry) or if a spreading code is used as a measuring signal having a spectral spreading, the spreading code modulating a sine-shaped carrier signal and processing the reflected measuring signals is carried out in a correlation calculation of the known spreading code with the received reflected measuring signal (SSTDR—spread-spectrum time-domain reflectometry).

The two last-mentioned methods both use a signal having a frequency spreading referred to as a spreading code as a measuring pulse in order to be able to better encounter disturbing influences on the ground connection in combination with a correlation calculation. Moreover, these methods require less power in comparison to the TDR method.

In the SSTDR method, via the multiplication of the sine-shaped carrier signal (modulation of the carrier signal), a frequency shift of the spread spectrum additionally occurs towards a frequency range suitable for transmitting the measuring signal.

Preferably, a pseudo random sequence or two sequences of a complementary code sent temporally alternating are used as spreading codes.

These sequences stand out due to their good correlation properties, the sequences of the complementary code in particular comprising an autocorrelation function whose values outside of the central value (zero-displacement) is exactly zero.

The other method in use for insulation fault identification in a branched power supply system and for status monitoring of the branched power supply system stands out by determining an image of all reflection positions on the power supply system as a reflection profile of the power supply system at a certain point of time based on a method of time-domain reflectometry and by carrying out a comparison of reflection profiles determined in temporal succession. A difference between the compared reflection profiles hints at a change of an electric status of the power supply system.

By recording a reflected measuring signal as a reflection profile of the power supply system in regular temporal intervals and by comparing each reflected profile with the previously recorded reflection profile, changes of the electric status of the power supply system can be identified. This permanent status monitoring allows, for example, making conclusions on changed network constellations or modes of operation (for example load changes).

Referring to a device, the object is attained by a device for insulation fault location in a branched, ungrounded power supply system, comprising the function units insulation fault test apparatus and insulation fault evaluation device having a measuring current transformer, which comprises, according to the invention, a time-domain reflectometer having a controller for controlling functional processes of the time-domain reflectometry measuring using the information supplied by the insulation fault evaluation device for identifying the faulty cable outlet.

When implementing the method according to the invention, the corresponding device comprises a time-domain reflectometer having a controller. The steps underlying the method are implemented in these devices.

Further advantageous embodiments can be taken from the following description and drawing, which shows a preferred embodiment of the invention by way of example.

DETAILED DESCRIPTION

In a schematic view, the Fig. shows an exemplary usage of the method according to the invention and the function units 12, 16, 30, 32, which implement the method, of a device for insulation fault location in a branched, ungrounded power supply system 2, which consists of a main system 4 having several cable outlets 6, which in turn comprise further cable outlets 6, to each of which a load 7 is connected. The cable outlets 6 normally comprise different cable lengths.

The power supply system 2 is constantly monitored by an insulation monitoring device 8 for a potential insulation fault 10. If such an insulation fault 10 has occurred, an insulation fault test apparatus 12 initiates the insulation fault location for determining the faulty cable outlet 14 by supplying a test current into the power supply system 2. In an insulation fault evaluation device 16, the signals detected by the measuring current transformer 18 are evaluated, so that the faulty cable outlet 14 can be identified by means of the relevant measuring current transformer 20, through which the test current flows due to the insulation fault 10.

Additionally, the time-domain reflectometer 30 supplies a time-domain reflectometry measuring pulse to the power supply system 2 when an insulation fault 10 occurs. This measuring pulse is reflected at all discontinuities of the characteristic wave impedance (impedance mismatch) of the cables of the power supply system 2, so that as a received reflected measuring signal, a sequence of reflected measuring pulses emerge as a temporal image of all reflection positions in the power supply system 2. In comparison to a case without faults, the reflected measuring signal comprises an additional reflected "insulation fault" measuring pulse, caused by the insulation fault 10, when a fault 10 occurs— which is an impedance mismatch—, the distance of the emerging position of the measuring signal (the distance between the "insulation fault" reflection position and time-domain reflectometer 30) being able to be determined from the running time. When combining this with the information received from the insulation fault evaluation device 16 on which cable outlet 20 has been identified as faulty, the position of the insulation fault 10 can therefore be exactly determined.

Insofar, the two mechanisms conventional insulation fault location and time-domain reflectometry measuring can function as supporting each other, in particular in widely branched power supply systems having weak reflecting measuring pulses.

A controller 32 controls the functional processes of the time-domain reflectometry measuring dependent on the information supplied by the insulation fault evaluation device for identifying the faulty cable outlet 14.

The function units insulation fault test apparatus 12, insulation fault evaluation device 16 and time-domain reflectometer 30 having a controller 32 can therefore be advantageously combined in a structural unit as an extended insulation fault location device. This extended insulation fault location device can moreover be structurally integrated into an insulation monitoring device 8.

The invention claimed is:

1. A method for insulation fault location in a branched, ungrounded power supply system, comprising the following steps:
   supplying a test current from an insulation fault test apparatus for determining a faulty cable outlet in at least one active conductor of the ungrounded power supply system,
   detecting a test current portion in a cable outlet of the ungrounded power supply system,
   evaluating the detected test current portion for identifying a faulty cable outlet,
   characterized in that determining an insulation fault position is realized by applying a spreading code to the at least one active conductor used as a measuring pulse produced according to a method of time-domain reflectometry in combination with evaluating information for identifying the faulty cable outlet.

2. The method according to claim 1, characterized in that determining the insulation fault position on the cable outlet identified as being faulty comprises the following steps:
   (a) producing the time-domain reflectometry measuring pulse and supplying the measuring pulse to the active conductor(s) of the power supply system,
   (b) receiving and recording a first reflected measuring signal consisting of a first sequence of reflected measuring signals as a temporal image of all reflection positions in the power supply system, should there be no insulation fault detected,
   (c) receiving a second reflected measuring signal consisting of a second sequence of reflected measuring pulses in the event of an occurring insulation fault,
   (d) deducting a difference signal, which represents the insulation fault, from the first reflected measuring signal and the second measuring signal,
   (e) determining the insulation fault position on the identified faulty cable outlet by evaluating a running time of the difference signal representing the insulation fault by using the information by means of which the cable outlet was identified as faulty.

3. The method according to claim 2, characterized in that a single impulse is produced and supplied as the measuring pulse.

4. The method according to claim 2, characterized in that the spreading code used as the measuring pulse has a spectral spreading and processing the reflected measuring signal is carried out in a correlation calculation of the known spreading code with the received reflected measuring signal.

5. The method according to claim 2, characterized in that the spreading code is used as the measuring pulse has a spectral spreading, the spreading code modulating a sine-shaped carrier signal, and processing the reflected measuring signal is carried out in a correlation calculation of the known spreading code with the received reflected measuring pulse.

6. The method according to claim 4, characterized in that a pseudo random sequence is used as the spreading code.

7. The method according to claim 4, characterized in that two sequences of a complementary code sent out temporally alternating are used as spreading codes.

8. A method for insulation fault identification in a branched power supply system and for status monitoring of the power supply system, comprising determining an image of all reflection positions on the power supply system as a reflection profile of the power supply system at a specific point of time based on a method of time-domain reflectometry, and comparing the reflection profiles identified in temporal succession, a difference between the compared reflection profiles indicating a change of an electric status of the power supply system.

9. A device for insulation fault location in a branched, ungrounded power supply system, comprising as function units insulation fault test apparatus and an insulation fault evaluation device having a measuring current transformer for determining a faulty cable outlet in the branched ungrounded power supply system by injecting a test current from the insulation fault test apparatus into at least one active conductor of the ungrounded power supply system, characterized by a time-domain reflectometer applying a spreading code as a measuring pulse to the at least one active conductor and having a controller for controlling functional processes of time-domain reflectometry measuring using the information supplied by the insulation fault evaluation device for identifying the faulty cable outlet in the branched ungrounded power supply system.

10. The device according to claim 9, characterized in that the controller for controlling functional processes of the time-domain reflectometer records a first reflected measuring signal or a signal derived therefrom as a reference pattern should no fault be detected, the reference pattern being compared to a currently determined second reflected measuring signal or a signal derived therefrom in the event of there being a fault in order to receive a difference signal representing the insulation fault position and to determine the exact fault position via running time evaluation in combination with the information on the identified faulty cable outlet.

* * * * *